United States Patent [19]

Kimura et al.

[11] Patent Number: 6,069,400
[45] Date of Patent: *May 30, 2000

[54] SEMICONDUCTOR DEVICE AND METHOD OF FABRICATING THE SAME

[75] Inventors: Masatoshi Kimura; Keiichi Higashitani; Takio Ohno, all of Tokyo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/850,007

[22] Filed: May 1, 1997

[30] Foreign Application Priority Data

Nov. 28, 1996 [JP] Japan ................................ 8-317941

[51] Int. Cl.[7] ........................ H01L 23/58; H01L 23/48; H01L 23/52
[52] U.S. Cl. ........................ 257/633; 257/635; 257/637; 257/774; 257/750; 257/758
[58] Field of Search .................. 257/633, 635, 257/637, 774, 750, 758, 752; 438/622, 625, 626

[56] References Cited

U.S. PATENT DOCUMENTS

| | | | |
|---|---|---|---|
| 4,734,754 | 3/1988 | Nikawa | 257/774 |
| 4,984,060 | 1/1991 | Ohmi et al. | 257/774 |
| 5,567,660 | 10/1996 | Chen et al. | 438/622 |

FOREIGN PATENT DOCUMENTS

| | | |
|---|---|---|
| 5-206298 | 8/1993 | Japan . |
| 7-335750 | 12/1995 | Japan . |
| 7-335754 | 12/1995 | Japan . |
| 8-203876 | 8/1996 | Japan . |

*Primary Examiner*—Mahshid Saadat
*Assistant Examiner*—Jhihan B. Clark
*Attorney, Agent, or Firm*—Oblon, Spivak, McClelland, Maier & Neustadt, P.C.

[57] ABSTRACT

A semiconductor device having a multi-level interconnection structure is disclosed which includes a metal interconnect wire (2) formed on a surface of an interlayer dielectric film (7) serving as a base; a high-stress TEOS oxide film (5), an SOG film (3), and a low-stress TEOS oxide film (6) which are deposited as interlayer dielectric films; and a contact hole (4), thereby decreasing stresses applied from the interlayer dielectric films to the metal interconnect wire to prevent metal hillocks in the contact hole.

12 Claims, 15 Drawing Sheets

F I G. 7
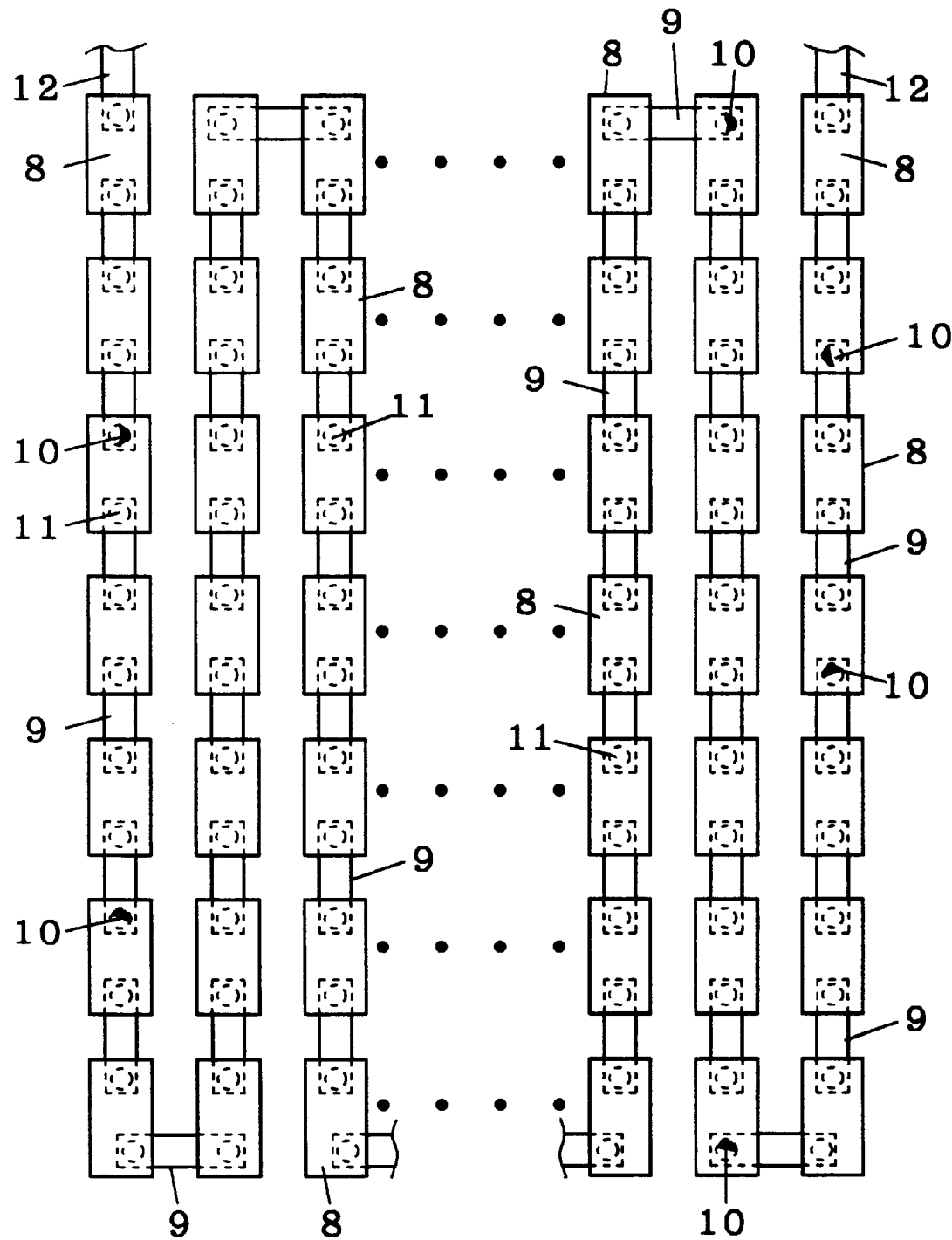

FIG. 28
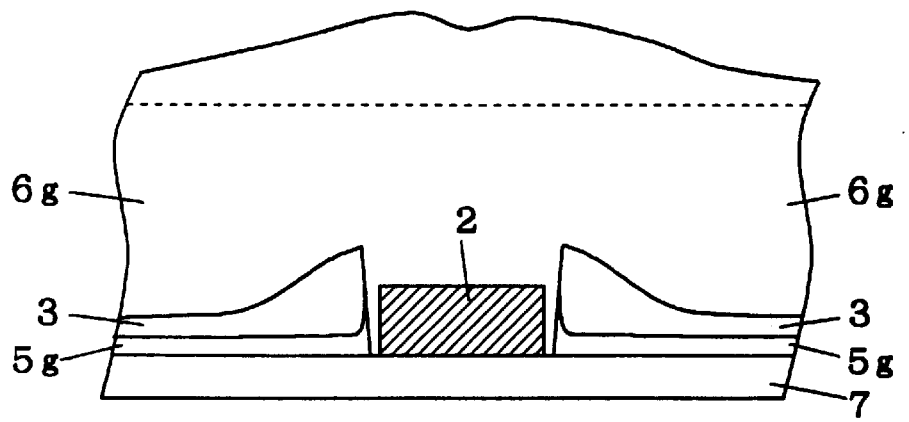
FIG. 29
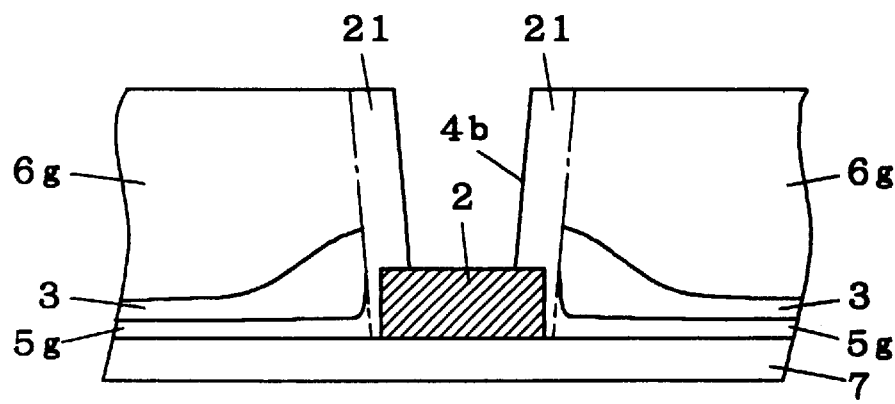
BACKGROUND ART FIG. 30
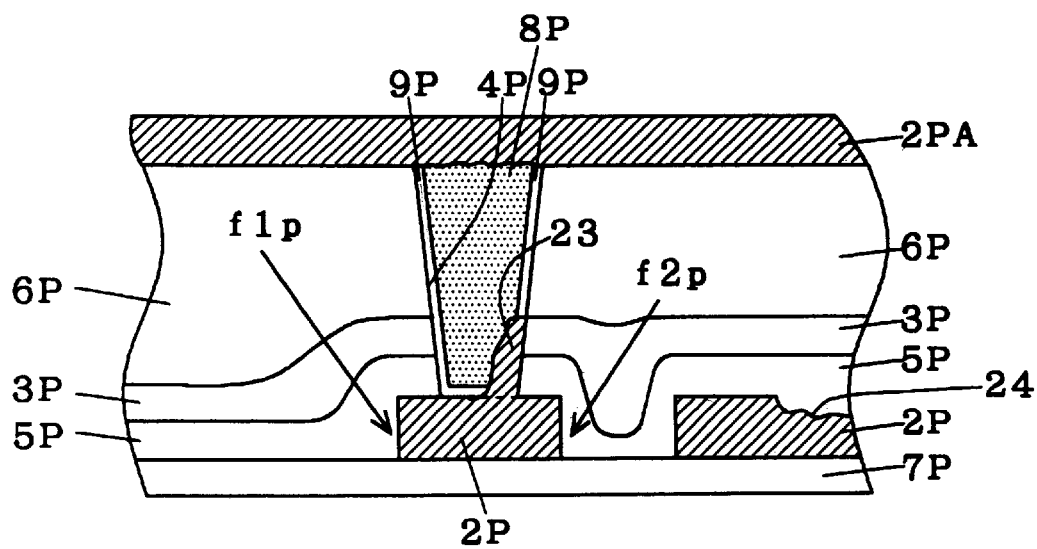

BACKGROUND ART FIG. 31
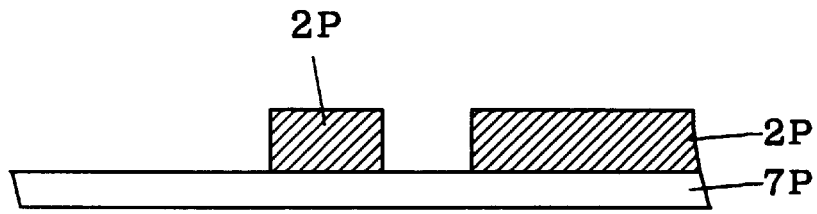
BACKGROUND ART FIG. 32
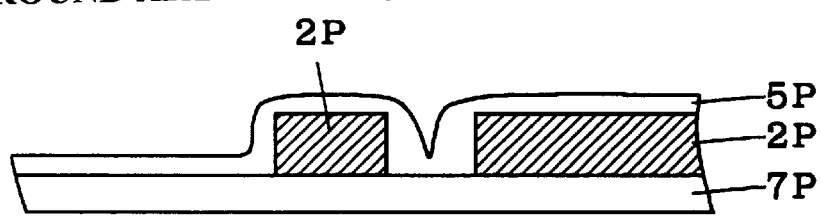
BACKGROUND ART FIG. 33
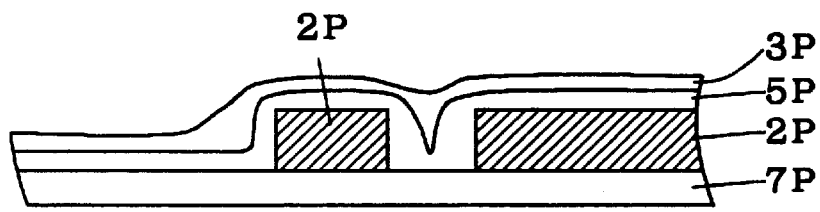
BACKGROUND ART FIG. 34
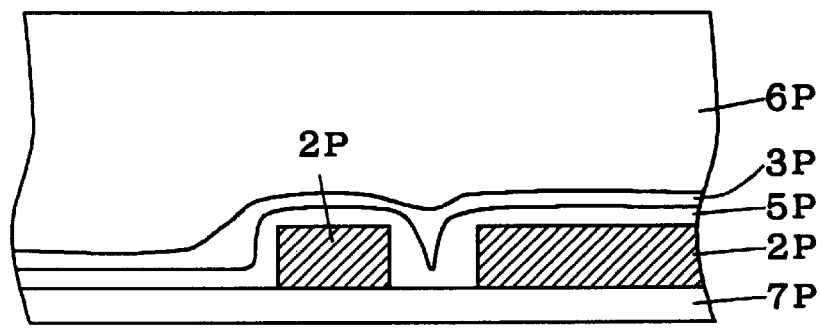

SEMICONDUCTOR DEVICE AND METHOD OF FABRICATING THE SAME

BACKGROUND OF THE INVENTION

1. Field of the Invention

The present invention relates to a semiconductor device and a method of fabricating the same. More particularly, the present invention relates to suppression of metal hillocks in contact holes for a multi-level interconnection structure.

2. Description of the Background Art

With reference to FIGS. 30 through 36, a brief description will now be given on a method of suppressing an excessive metal deposition (hillock) in a contact hole 4P for a background art multi-level interconnection structure.

FIG. 30 is a schematic cross-sectional view of an excessive metal deposition (hillock) in a contact hole. FIGS. 31 through 36 are cross-sectional views showing fabrication steps wherein such an excessive metal deposition (hillock) is formed.

In FIGS. 30 through 36, the reference character 2P designates lower metal interconnect layers (e.g., AlCu interconnect wires); 2PA designates an upper metal interconnect layer; 3P designates a SOG (spin on glass) layer; 4P designates a contact hole (connect hole) for connecting the upper and lower metal interconnect layers; 5P designates an interlayer dielectric film (e.g., TEOS oxide film); 7P designates an insulation film (specifically a $SiO_2$ film) serving as a base; 8P designates tungsten; 9P designates barrier metal; and 23 and 24 designate an excessive metal deposition (hillock) in the contact hole and a metal void, respectively, which are the problems of the background art.

The process and reason why the excessive metal deposition (hillock) is created in such a contact hole will be described with reference to the cross-sections of FIGS. 31 through 36 which illustrate the fabrication steps. The process steps prior to the metal interconnection formation, that is, the formation of a transistor, are not illustrated and described in FIG. 31.

First, the Al interconnect wires 2P as an example of the metal interconnect wires are formed on the insulation film 7P serving as the base. The formation of the Al interconnect wires 2P comprises depositing AlCu or AlSiCu over the insulation film 7P by sputtering, performing etching by photolithography using a resist which causes predetermined portions of the AlCu or AlSiCu to be left (FIG. 31), and depositing the interlayer dielectric film 5P (2000 to 5000 angstroms) to entirely cover the Al interconnect wires 2P (FIG. 32). A TEOS oxide film is then used, for example. Next, the SOG (spin on glass) film 3P is applied to the entire top surface to fill a gap in the interlayer dielectric film 5P formed on the Al interconnect wires 2P as illustrated in FIG. 33. Then, the SOG film 3P is sintered by annealing. The SOG film 3P builds up in a corner portion of an open region (a region wherein the metal interconnect wires are widely spaced apart from each other) of the Al interconnect wires 2P to provide a gentle slope of the step.

The interlayer dielectric film 6P (10000 to 25000 angstroms) (a TEOS oxide film in this case) is deposited over the top surface, and is then flattened by the CMP (chemical mechanical polishing) technique to provide a structure shown in FIG. 34. In the CMP technique described herein, the TEOS oxide film is deposited to a thickness several times greater than the height of the step of the metal interconnect wires, and is then polished to a desired thickness.

Referring to FIG. 35, the contact holes 4P are formed in predetermined regions by photolithography and etching. At the time when the contact holes 4P are formed, the excessive metal deposition (hillock) 23 in the contact hole 4P and the metal void 24 as shown in FIG. 36 are not present.

Finally, the contact holes 4P are filled with metal. The tungsten plug technique (filling the contact holes 4P using blanket WCVD) is described herein. For filling the contact holes 4P with the tungsten 8P, an oxide film (not shown) is removed by inert gas (e.g., Ar) or nitrogen gas sputter etching and degassing (lamp heating) is performed for removing gases such as $H_2O$ and $H_2$ from the SOG layer 3P in a sputtering system. The metal interconnect wires 2P softened by heat generated during the degassing and stresses f1$p$ and f2$p$ caused by the thickness of the TEOS oxide film 6P create the excessive metal deposition (hillock) 23 and the metal void 24. In general, the commonly used degassing is an RTA (rapid thermal annealing) and the like. After the degassing, the barrier metal 9P (e.g., TiN film or Ti film) having a thickness of 200 to 3000 angstroms is deposited. The tungsten 8P is grown in the contact holes 4P and on the first interlayer dielectric film 6P by the CVD process of the tungsten 8P, and is then etched back so that only the tungsten 8P in the contact holes 4P is left. The upper metal interconnect wire 2PA is deposited for electrical connection. During the above described degassing, the excessive metal depositions (hillocks) 23 in the contact holes 4P and the metal void 24 are formed.

The background art multi-level interconnection structure constructed as above described presents drawbacks to be described below. As described with reference to FIG. 30, the metal interconnect wires 2P softened by the heat generated during the degassing and the stresses f1$p$ and f2$p$ of the interlayer dielectric film 6P having a great thickness formed on upper and side portions of the metal interconnect wires 2P create the excessive metal deposition (hillock) 23 and the metal void 24. Such excessive metal depositions (hillocks) 23 of the metal interconnect wires 2P in the contact holes 4P cause voids in the metal interconnect wires connected to the contact holes 4P, the unevenness of the barrier metal 9P during the formation of the plug of the tungsten 8P, and the abnormal growth and filling failure of the tungsten 8P. These drawbacks also result in the degradation of the electrical characteristics of the tungsten 8P, and the decrease in yield of the device.

For instance, the stresses f1$p$ and f2$p$ of the upper interlayer dielectric film 6P having the great thickness shown in FIG. 30 propagate through the SOG film 3P to the lower interlayer dielectric film 5P, and are consequently applied to the sides of the metal interconnect wires 2P. The application of the stresses f1$p$ and f2$p$ of the thick interlayer dielectric film 6P formed on the upper and side portions of the metal interconnect wires 2P causes the metal hillock 23 and the metal void 24. The result is the unevenness of the barrier metal 9P during the formation of the plug of the tungsten 8P in the contact hole 4P, and the abnormal growth and filling failure of the tungsten 8P.

In this manner, the heat generated during the degassing for fabrication of the multi-level interconnection structure and the stresses caused by the thickness of the interlayer dielectric film create the metal hillock and metal void. These drawbacks result in the unevenness of the barrier metal during the formation of the plug of the tungsten, the abnormal growth and filling failure of the tungsten, the degradation of the electrical characteristics of the tungsten, and the decrease in yield of the device.

SUMMARY OF THE INVENTION

According to a first aspect of the present invention, a semiconductor device having a multi-level interconnection structure comprises: a metal interconnect wire formed on an insulation film serving as a base; a first interlayer dielectric film formed to cover the metal interconnect wire; a second interlayer dielectric film formed on the first interlayer dielectric film; a third interlayer dielectric film formed on the second interlayer dielectric film; and a contact hole extending through the first, second, and third interlayer dielectric films to a surface of the metal interconnect wire, the first and third interlayer dielectric films having different stresses.

Preferably, according to a second aspect of the present invention, the first and third interlayer dielectric films are made of the same material.

Preferably, according to a third aspect of the present invention, the third interlayer dielectric film has a lower stress and a greater thickness than the first interlayer dielectric film.

According to a fourth aspect of the present invention, a semiconductor device having a multi-level interconnection structure comprises: a metal interconnect wire formed on an insulation film serving as a base; an interlayer dielectric film formed to cover the metal interconnect wire; and a contact hole extending through the interlayer dielectric film to a surface of the metal interconnect wire, wherein the metal interconnect wire having the contact hole includes a plurality of metal interconnect wires, and dummy metal interconnect wires are provided adjacent only some of the metal interconnect wires which surround contact holes located in a peripheral area of the semiconductor device.

According to a fifth aspect of the present invention, a semiconductor device having a multi-level interconnection structure comprises: a metal interconnect wire formed on an insulation film serving as a base; an interlayer dielectric film formed to cover the metal interconnect wire; and a contact hole extending through said interlayer dielectric film to a surface of the metal interconnect wire, wherein a space portion is provided in the interlayer dielectric film adjacent the metal interconnect wire.

Preferably, according to a sixth aspect of the present invention, the space portion is formed as an air gap in the interlayer dielectric film.

Preferably, according to a seventh aspect of the present invention, the space portion includes a plurality of space portions of a contact hole configuration.

Preferably, according to an eighth aspect of the present invention, the space portion is a space provided by enlarging the contact hole so that the metal interconnect wire is out of contact with the interlayer dielectric film.

According to a ninth aspect of the present invention, a semiconductor device having a multi-level interconnection structure comprises: a metal interconnect wire formed on an insulation film serving as a base; an interlayer dielectric film formed to cover the metal interconnect wire; and a contact hole formed by filling side surfaces of a hole with a cover portion, the hole extending through the interlayer dielectric film to a surface of the metal interconnect wire.

Preferably, according to a tenth aspect of the present invention, the cover portion covers the entire side surfaces of the hole.

Preferably, according to an eleventh aspect of the present invention, the cover portion is a side wall.

Preferably, according to a twelfth aspect of the present invention, the cover portion includes a gas release prevention film provided by once filling the hole and then forming the contact hole.

A thirteenth aspect of the present invention is intended for a method of fabricating a semiconductor device having a multi-level interconnection structure. According to the present invention, the method comprises the steps of: providing a metal interconnect wire on an insulation film serving as a base; forming an interlayer dielectric film for covering the metal interconnect wire; forming a contact hole extending through the interlayer dielectric film to a surface of the metal interconnect wire; performing a degassing process for removing gas from the interlayer dielectric film in the contact hole; and growing metal in the contact hole, wherein the degassing process is performed below 250° C.

According to a fourteenth aspect of the present invention, a method of fabricating a semiconductor device having a multi-level interconnection structure comprises the steps of: providing a metal interconnect wire on an insulation film serving as a base; forming an interlayer dielectric film for covering the metal interconnect wire; forming a contact hole extending through the interlayer dielectric film to a surface of the metal interconnect wire; and performing a degassing process for removing gas from the interlayer dielectric film in the contact hole, wherein the degassing process is performed in an inert gas or nitrogen gas atmosphere.

Preferably, according to a fifteenth aspect of the present invention, the inert gas comprises argon.

In accordance with the first aspect of the present invention, changing the stress of one of the first and third interlayer dielectric films may alleviate the stresses of the thickness of the third interlayer dielectric film upon the metal interconnect wire to suppress the metal hillocks which have been formed in the background art. This eliminates such problems as a metal void, the unevenness of barrier metal during the formation of a tungsten plug, and the abnormal growth and filling failure of the tungsten, preventing the degradation of the electrical characteristics of the tungsten and the decrease in yield of the device.

In accordance with the second aspect of the present invention, the first and third interlayer dielectric films are made of the same material. This facilitates the production of the interlayer dielectric films when a wafer is formed. Further, as in the first aspect, the stresses of the thickness of the third interlayer dielectric film upon the metal interconnect wire are alleviated, and the metal hillocks which have been formed in the background art are suppressed. This eliminates such problems as the metal void, the unevenness of the barrier metal during the formation of the tungsten plug, and the abnormal growth and filling failure of the tungsten, preventing the degradation of the electrical characteristics of the tungsten and the decrease in yield of the device.

In accordance with the third aspect of the present invention, the third interlayer dielectric film has a greater thickness and a lower stress. This further alleviates the stresses of the thickness of the third interlayer dielectric film upon the metal interconnect wire, suppressing more metal hillocks than those in the first and second aspects. This eliminates such problems as the metal void, the unevenness of the barrier metal during the formation of the tungsten plug, and the abnormal growth and filling failure of the tungsten, preventing the degradation of the electrical characteristics of the tungsten and the decrease in yield of the device.

In accordance with the fourth aspect of the present invention, the dummy metal interconnect wires are provided adjacent only the metal interconnect wires located in the peripheral area of the semiconductor device to eliminate an open space, suppressing the metal hillocks which have been formed in the background art. This eliminates such problems as the metal void, the unevenness of the barrier metal during the formation of the tungsten plug, and the abnormal growth and filling failure of the tungsten, preventing the degradation of the electrical characteristics of the tungsten and the decrease in yield of the device.

In accordance with the fifth aspect of the present invention, the space portion adjacent the metal interconnect wire may alleviate the stresses applied to the periphery of metal, preventing the metal hillocks. This eliminates such problems as the metal void, the unevenness of the barrier metal during the formation of the tungsten plug, and the abnormal growth and filling failure of the tungsten, preventing the degradation of the electrical characteristics of the tungsten and the decrease in yield of the device.

In accordance with the sixth aspect of the present invention, the space portion is formed in the interlayer dielectric film to suppress the direct application of the stresses to the side walls of the metal interconnect wire. This alleviates more stresses of the thickness of the interlayer dielectric film than does in the fifth aspect. As a result, the metal hillocks are suppressed. This eliminates such problems as the metal void, the unevenness of the barrier metal during the formation of the tungsten plug, and the abnormal growth and filling failure of the tungsten, preventing the degradation of the electrical characteristics of the tungsten and the decrease in yield of the device.

In accordance with the seventh aspect of the present invention, the space portion includes the plurality of space portions of the contact hole configuration to alleviate the direct application of more stresses of the thickness of the interlayer dielectric film to the metal interconnect wire than does in the fifth aspect as in the sixth aspect. As a result, the metal hillocks are suppressed. This eliminates such problems as the metal void, the unevenness of the barrier metal during the formation of the tungsten plug, and the abnormal growth and filling failure of the tungsten, preventing the degradation of the electrical characteristics of the tungsten and the decrease in yield of the device.

In accordance with the eighth aspect of the present invention, the space portion is adapted so that the metal interconnect wire is out of contact with the interlayer dielectric film to alleviate the direct application of more stresses of the thickness of the interlayer dielectric film to the metal interconnect wire than does in the fifth aspect as in the seventh aspect. As a result, the metal hillocks are suppressed. This eliminates such problems as the metal void, the unevenness of the barrier metal during the formation of the tungsten plug, and the abnormal growth and filling failure of the tungsten, preventing the degradation of the electrical characteristics of the tungsten and the decrease in yield of the device.

In accordance with the ninth aspect of the present invention, the contact hole is formed in the interlayer dielectric film in such a manner that parts of the contact hole is filled with the cover portion. The fabrication step of releasing gases in the interlayer dielectric film is dispensed with. This eliminates the need for the degassing process which has been required in the background art. As a result, the metal hillocks themselves are not created. This eliminates such problems as the metal void, the unevenness of the barrier metal during the formation of the tungsten plug, and the abnormal growth and filling failure of the tungsten, preventing the degradation of the electrical characteristics of the tungsten and the decrease in yield of the device.

In accordance with the tenth aspect of the present invention, the contact hole is formed such that the side walls thereof are entirely filled with the cover portion to permit easier wafer production of the wafer during the formation of the cover portion than in the ninth aspect. As in the ninth aspect, the fabrication step of releasing gases in the interlayer dielectric film is dispensed with. This eliminates the need for the degassing process which has been required in the background art. As a result, the metal hillocks themselves are not created. This eliminates such problems as the metal void, the unevenness of the barrier metal during the formation of the tungsten plug, and the abnormal growth and filling failure of the tungsten, preventing the degradation of the electrical characteristics of the tungsten and the decrease in yield of the device.

In accordance with the eleventh aspect of the present invention, the cover portion is the side wall, which permits the fabrication step of releasing gases in the interlayer dielectric film to be dispensed with as in the ninth aspect. This eliminates the need for the degassing process which has been required in the background art. As a result, the metal hillocks themselves are not created. This eliminates such problems as the metal void, the unevenness of the barrier metal during the formation of the tungsten plug, and the abnormal growth and filling failure of the tungsten, preventing the degradation of the electrical characteristics of the tungsten and the decrease in yield of the device.

In accordance with the twelfth aspect of the present invention, the cover portion is the gas release prevention film, which allows a smaller top diameter of the contact hole than that in the ninth aspect to decrease the wiring pitch of the metal interconnect wires as in the background art for size reduction of the device. Further, the fabrication step of releasing gases in the interlayer dielectric film is dispensed with as in the ninth aspect. This eliminates the need for the degassing process which has been required in the background art. As a result, the metal hillocks themselves are not created. This eliminates such problems as the metal void, the unevenness of the barrier metal during the formation of the tungsten plug, and the abnormal growth and filling failure of the tungsten, preventing the degradation of the electrical characteristics of the tungsten and the decrease in yield of the device.

In accordance with the thirteenth aspect of the present invention, the degassing process is performed below 250° C. to prevent high-temperature heat from being transferred to the metal, suppressing the metal hillocks which have been formed in the background art. This eliminates such problems as the metal void, the unevenness of the barrier metal during the formation of the tungsten plug, and the abnormal growth and filling failure of the tungsten, preventing the degradation of the electrical characteristics of the tungsten and the decrease in yield of the device.

In accordance with the fourteenth aspect of the present invention, the degassing process is performed in the inert gas or nitrogen gas atmosphere, suppressing the metal hillocks which have been formed in the background art. This eliminates such problems as the metal void, the unevenness of the barrier metal during the formation of the tungsten plug, and the abnormal growth and filling failure of the tungsten, preventing the degradation of the electrical characteristics of the tungsten and the decrease in yield of the device.

In accordance with the fifteenth aspect of the present invention, the degassing process is performed in the argon gas atmosphere, suppressing more metal hillocks than in the fourteenth aspect. This eliminates such problems as the metal void, the unevenness of the barrier metal during the formation of the tungsten plug, and the abnormal growth and filling failure of the tungsten, preventing the degradation of the electrical characteristics of the tungsten and the decrease in yield of the device.

It is an object of the present invention to provide a semiconductor device which suppresses a metal hillock in a contact hole, and a method of fabricating the same.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a plan view of a layout pattern of a hole chain TEG of the semiconductor device according to a fourth preferred embodiment of the present invention;

FIGS. 25 through 29 are cross-sectional views showing respective steps of fabrication of the semiconductor device according to the ninth preferred embodiment of the present invention;

FIG. 30 is a schematic cross-sectional view showing a metal hillock in a contact hole of a semiconductor device having a background art multi-level interconnection structure; and FIGS. 31 through 36 are cross-sectional views showing respective steps of fabrication of the semiconductor device having the background art multi-level interconnection structure.

DESCRIPTION OF THE PREFERRED EMBODIMENTS (Preferred Embodiment 1)

A method of fabricating a semiconductor device according to a first preferred embodiment of the present invention will now be described with reference to the drawings.

Figure 1:
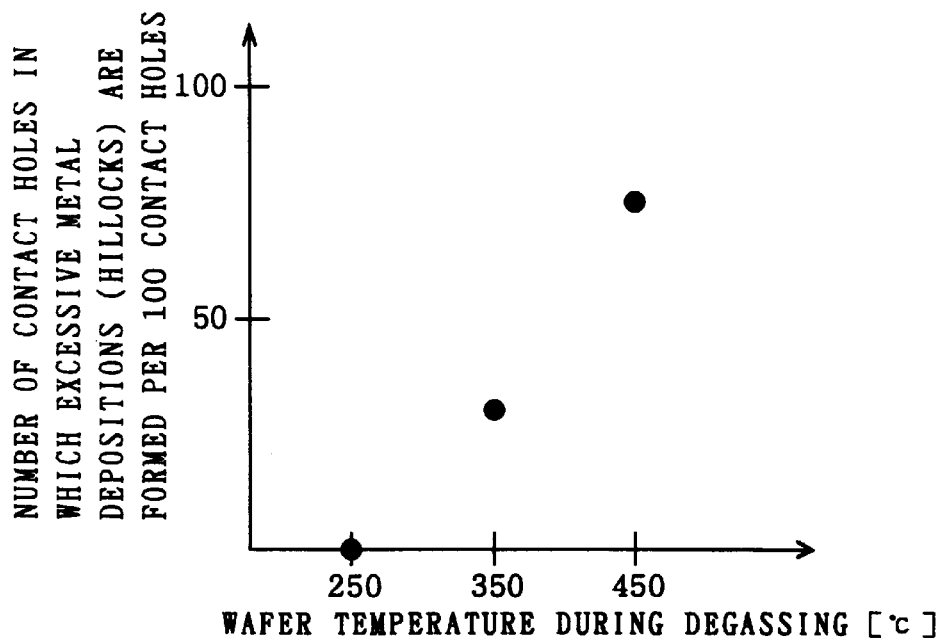
FIG. 1 illustrates plots of the number of contact holes in which excessive metal depositions (hillocks) are formed per 100 contact holes versus a wafer temperature during degassing for comparison between a first preferred embodiment of the present invention and the background art.

FIG. 1 is a graph showing experimental results of a wafer temperature during degassing prior to the formation of the barrier metal 9P shown in FIG. 30, and illustrates plots of the number of contact holes in which excessive metal depositions (hillocks) are formed per 100 contact holes versus the wafer temperature. The number of contact holes described herein is the number of contact holes in which the excessive metal depositions (hillocks) 23 are formed among 100 contact holes of a memory peripheral circuit of a specific device.

The semiconductor device during degassing according to the first preferred embodiment is similar in construction to the background art semiconductor device described with reference to FIG. 35, and comprises metal interconnect wires 2P, TEOS oxide films 5P and 6P serving as interlayer dielectric films, and an SOG film 3P serving as an interlayer dielectric film.

The fabrication steps and cross-sectional structure of the semiconductor device except degassing prior to the barrier metal formation according to the first preferred embodiment of the present invention are identical with those of the background art semiconductor device (FIGS. 31 through 35).

Referring to FIG. 1, no excessive metal depositions (hillocks) 23 are created at 250° C. wafer temperature during the degassing, but the number of contact holes in which the excessive metal depositions (hillocks) 23 are formed increases above 350° C. It is hence necessary to carry out the degassing prior to the formation of the barrier metal 9P below 250° C. wafer temperature in order to prevent the excessive metal depositions (hillocks) 23 from being formed in the contact holes 4P shown in FIG. 30.

Figure 35:
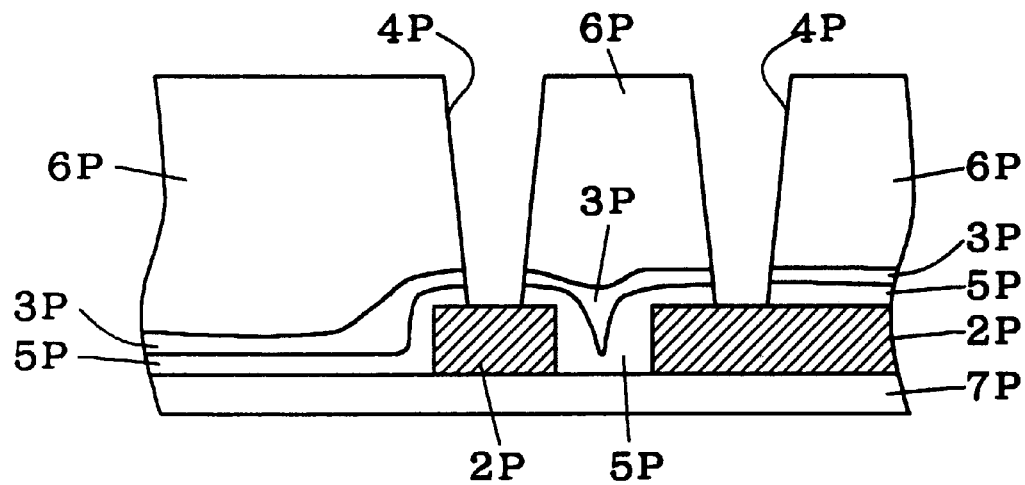
Figure 36:
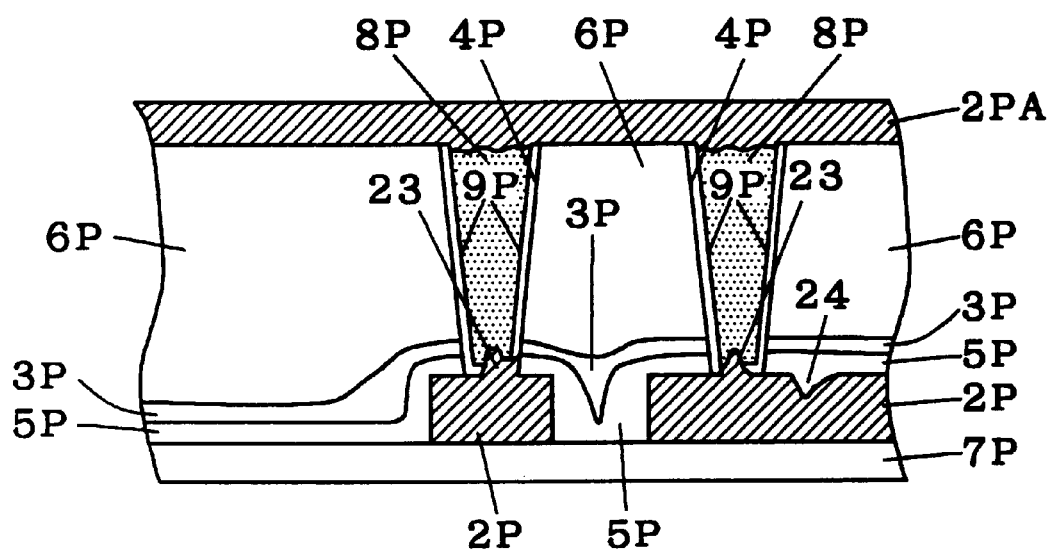

In the background art semiconductor device, the application of heat produced by the degassing in addition to the application of the stresses f1p and f2p of the thickness of the TEOS oxide films 5P and 6P shown in FIG. 30 to the side walls of the metal interconnect wires 2P shown in FIG. 35 softens the metal interconnect wires 2P which in turn are prone to deform. The forces of the stresses f1p and f2p toward the side walls of the metal interconnect wires 2P cause the excessive metal depositions (hillocks) 23.

According to the present invention, on the other hand, heat treatment is carried out below the 250° C. wafer temperature so that the excessive metal depositions (hillocks) 23 are not formed during the degassing. Then, high-temperature heat transfer to the metal interconnect wires 2P as in the background art does not occur, and the excessive metal depositions (hillocks) 23 are thus prevented from being created. This eliminates such problems as the metal void 24, the unevenness of the barrier metal 9P during the formation of the tungsten plug 8P, and the abnormal growth and filling failure of the tungsten 8P to prevent the degradation of the electrical characteristics of the tungsten 8P and the decrease in yield of the device.

(Preferred Embodiment 2)

The method of fabricating the semiconductor device according to a second preferred embodiment of the present invention is described below with reference to FIG. 2.

Figure 2:
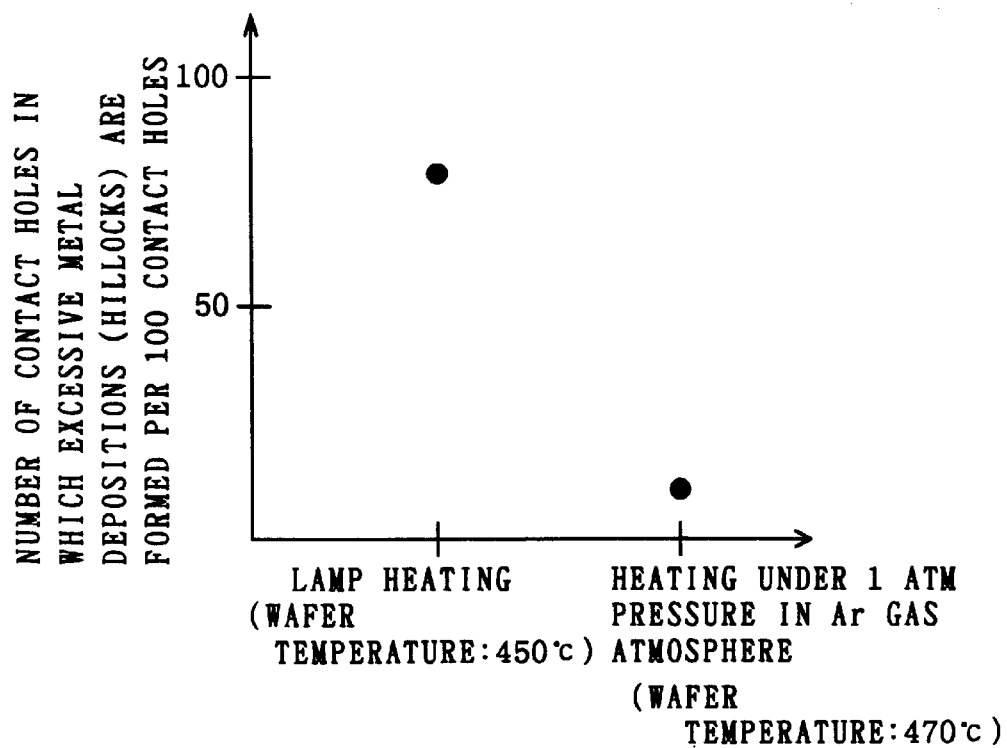
FIG. 2 illustrates plots of the number of contact holes in which the excessive metal depositions (hillocks) are formed per 100 contact holes versus lamp heating and heating in an Ar gas atmosphere for comparison between a second preferred embodiment of the present invention and the background art.

FIG. 2 illustrates plots of the number of contact holes in which the excessive metal depositions (hillocks) are formed per 100 contact holes in a memory peripheral circuit portion for comparison between the background art lamp heating during the degassing and heating under a pressure of 1 atm in an Ar gas (inert gas) or $N_2$ gas (nitrogen gas) atmosphere during degassing according to the present invention.

The semiconductor device during the degassing according to the second preferred embodiment is similar in construction to the background art semiconductor device shown in FIG. 30, and comprises the metal interconnect wires 2P, the TEOS oxide films 5P and 6P serving as the interlayer dielectric films, and the SOG film 3P serving as the interlayer dielectric film. In the second preferred embodiment, the degassing in the Ar (argon) atmosphere is discussed below.

As illustrated in FIG. 2, the number of contact holes in which the excessive metal depositions (hillocks) are formed in the case of heat treatment in the Ar gas atmosphere (1 atm) (the Ar gas is heated and applied to the wafer to increase the temperature) during the degassing of the present invention is much less than that in the case of the background art lamp heating during the degassing at a similar wafer surface temperature.

In this manner, the second preferred embodiment features the heat treatment in the Ar atmosphere (1 atm) without using the lamp heating during the degassing prior to the sputtering of the barrier metal. Theoretically, other inert gases and nitrogen gas are applicable.

As above described, the heat treatment during the degassing does not employ the background art lamp but is carried out in the Ar gas atmosphere (1 atm) to suppress the creation of the excessive metal depositions (hillocks) 23 shown in FIG. 29. This eliminates such problems as the metal void 24, the unevenness of the barrier metal 9P during the formation of the tungsten plug 8P, and the abnormal growth and filling failure of the tungsten 8P, thereby preventing the degradation of the electrical characteristics of the tungsten 8P and the decrease in yield of the device.

(Preferred Embodiment 3)

The semiconductor device according to a third preferred embodiment of the present invention is described below with reference to FIGS. 3 through 6.

Figure 3:
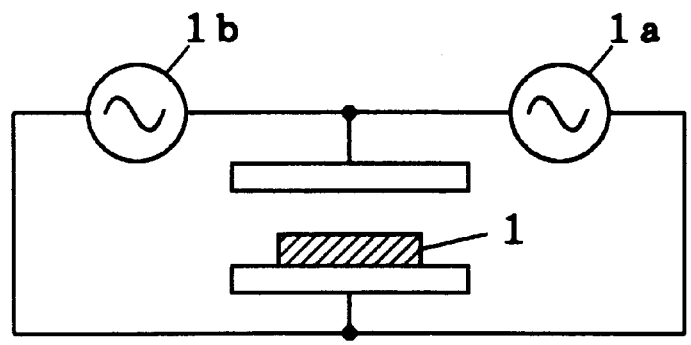
FIG. 3 illustrates a 2-frequency plasma CVD reactor system used for production of a wafer of a semiconductor device in a simplified form according to a third preferred embodiment of the present invention.

FIG. 3 illustrates a 2-frequency plasma CVD reactor system (parallel plate type) used for production of a wafer of the present invention in a simplified form.

Figure 4:
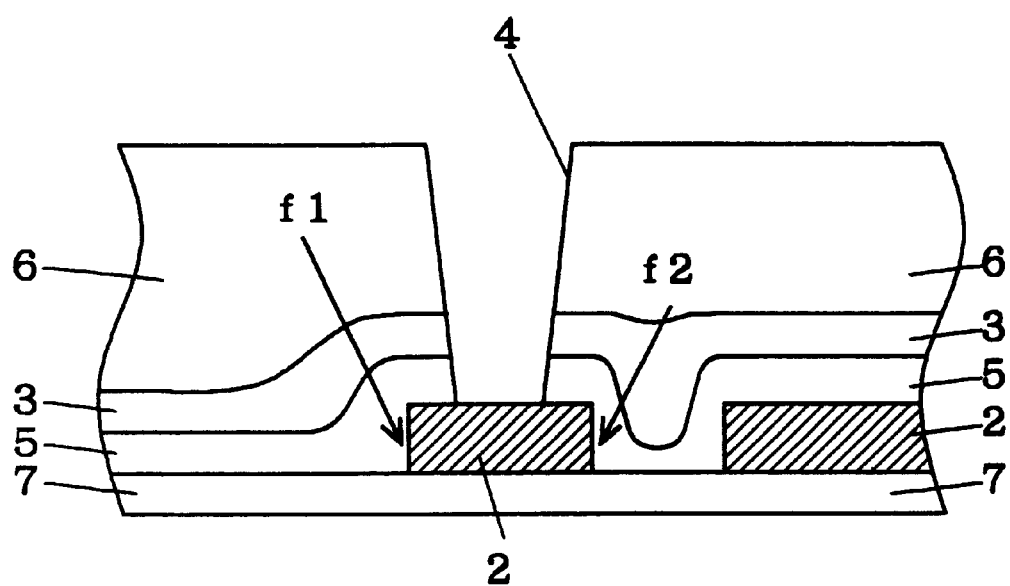
FIG. 4 is an enlarged cross-sectional view of a contact hole portion of the semiconductor device according to the third preferred embodiment of the present invention.

FIG. 4 is a cross-sectional view of the semiconductor device according to the third preferred embodiment of the present invention. In the structure of FIG. 4, upper and lower TEOS oxide films 6 and 5 are deposited films having low and high stresses ($dyn/cm^2$), respectively. The semiconductor device of FIG. 4 differs from the background art semiconductor device in that the stress of the upper interlayer dielectric film is lower than the stress of the lower interlayer dielectric film.

Figure 5:
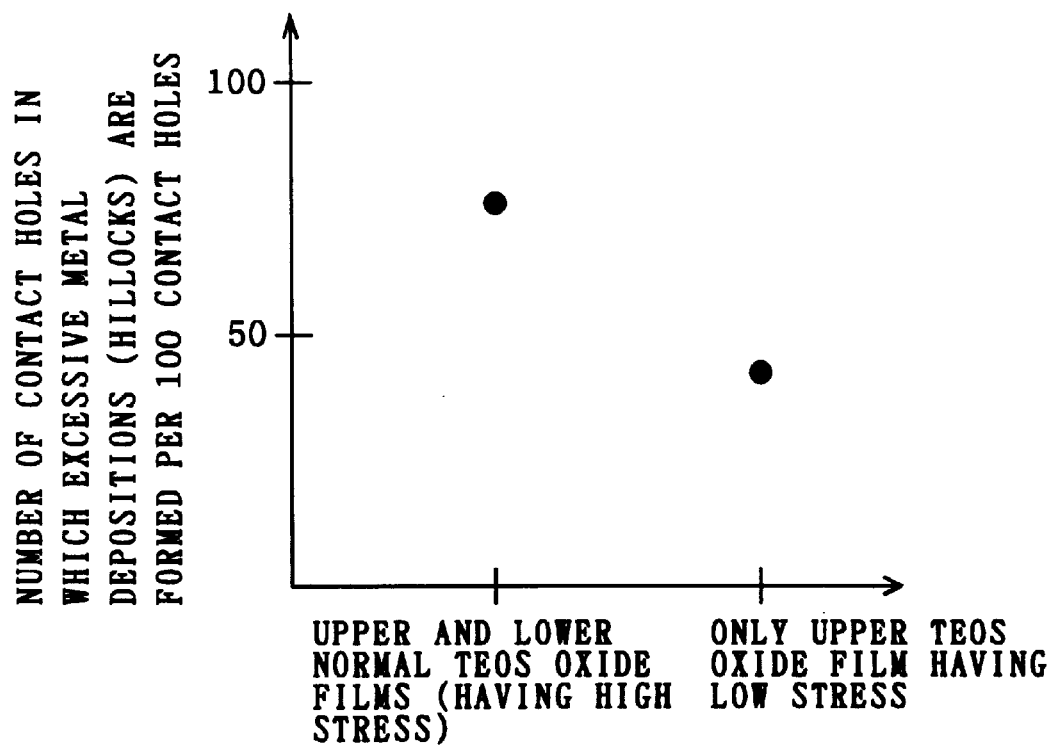
FIG. 5 illustrates plots of the number of contact holes in which the excessive metal depositions (hillocks) are formed per 100 contact holes versus stresses of a TEOS oxide film of the semiconductor device according to the third preferred embodiment of the present invention.

FIG. 5 illustrates plots of the number of contact holes in which the excessive metal depositions (hillocks) are formed per 100 contact holes in the memory peripheral circuit portion versus the first and second arrangements of the TEOS oxide films. In the first arrangement, the lower and upper TEOS oxide films of FIG. 4 have the high stress. In the second arrangement, the lower TEOS oxide film has the high stress but the upper TEOS oxide film has the low stress. That is, the experiment examines the influence of the two TEOS oxide films having high and low stresses, respectively. The present invention is based on the experimental results.

Figure 6:
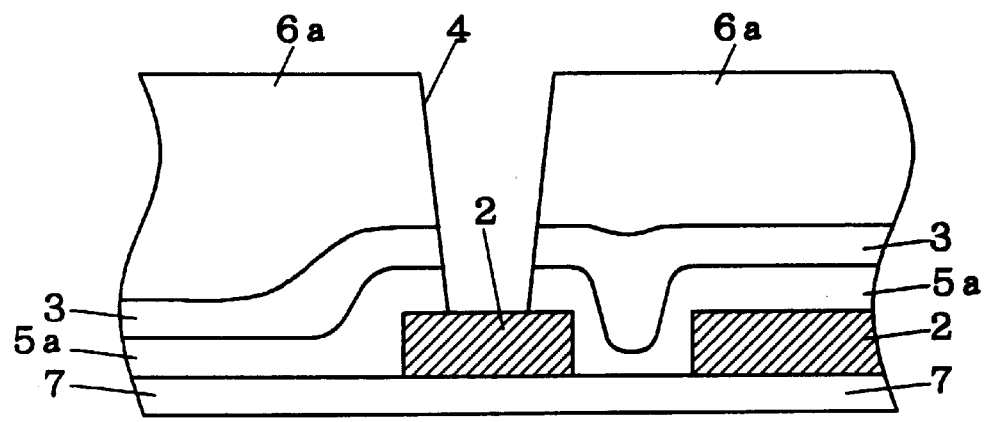
FIG. 6 is an enlarged cross-sectional view of the contact hole portion of the semiconductor device according to the third preferred embodiment of the present invention.

FIG. 6 is a cross-sectional view of the semiconductor device according to the present invention wherein an upper TEOS oxide film 6a has the high stress and a lower TEOS oxide film Sa has the low stress in contrast to the semiconductor device of FIG. 4. The fabrication step of the semiconductor device of FIGS. 4 and 6 are identical with those of the background art semiconductor device (FIGS. 31 through 35).

In FIG. 3, the reference numeral 1 designates a wafer; and the reference characters 1a and 1b designate superimposed RF power supplies. In FIG. 4, the reference numeral 2 designates metal interconnect wires; 3 designates an SOG film (second interlayer dielectric film); 4 designates a contact hole; 5 designates a high-stress TEOS oxide film (first interlayer dielectric film); 6 designates a low-stress TEOS oxide film (third interlayer dielectric film); and 7 designates an interlayer dielectric film comprised of $SiO_2$ and the like. With reference to FIG. 6, the lower first interlayer dielectric film is the TEOS oxide film 5a having the low stress, and the upper third interlayer dielectric film is the TEOS oxide film 6a having the high stress.

The production of the low-stress TEOS oxide film 6 of the semiconductor device of FIG. 4 may be accomplished by optimizing the power of a high-frequency power supply for plasma CVD. More specifically, the output power from the RF power supply 1a of FIG. 3 is initially set to 150 to 350 (w), and the output power from the RF power supply 1b of FIG. 3 is initially set to 20 to 100 (w). Varying the power from the RF power supply 1b allows the production of the TEOS oxide film having different stresses.

The TEOS oxide films, for example, are described. The high-stress TEOS oxide film has a low etching rate and a high dielectric breakdown voltage. The low-stress TEOS oxide film has a high etching rate and a low dielectric breakdown voltage. Specifically, the low-stress interlayer dielectric film is porous and causes degradation in step coverage relative to the step of the metal interconnect wires 2, dielectric breakdown voltage, and hygroscopicity resistance. In the structure of the third preferred embodiment shown in FIG. 4, the lower layer is the high-stress interlayer dielectric film 5 and the upper layer is the low-stress interlayer dielectric film 6 which may suppress the excessive metal depositions (hillocks) 23 of FIG. 30 so that preferred step coverage is provided relative to the step of the metal interconnect wires 2.

In effect, the number of excessive metal depositions (hillocks) 23 of FIG. 30 in the structure of the third preferred embodiment shown in FIG. 4 (wherein only the upper layer is the low-stress TEOS oxide film) is less than that in the background art structure shown in FIG. 5 (wherein the upper and lower layers are the normal high-stress TEOS oxide films).

Increasing the thickness of the lower interlayer dielectric film 5 of FIG. 4 increases the likelihood of production of an air gap between the metal interconnect wires 2 during the deposition of the lower interlayer dielectric film 5 before a gap in the TEOS oxide film 5 is filled with the SOG film 3. In most cases, the thin lower interlayer dielectric film is generally deposited between the metal interconnect wires, and the remaining gap is filled with the SOG film. Then, the CMP technique is used to globally flatten the steps and to achieve the desired thicknesses.

The necessity to make the upper interlayer dielectric film to be thicker than the lower interlayer dielectric film will be understood from the above description. The deposition of the upper TEOS oxide film 6 having the low stress of FIG. 4 is considered to decrease the stresses f1 and f2 applied to the side walls of the metal interconnect wires 2 through the SOG film 3 and the lower high-stress TEOS oxide film 5, resulting in lesser contact holes 4 in which the excessive metal depositions (hillocks) 23 are formed.

Conversely, when the high-stress TEOS oxide film 6a is the upper layer and the low-stress TEOS oxide film 5a is the lower layer as illustrated in FIG. 6, the stresses from the high-stress TEOS oxide film 6a are applied to the side walls of the metal interconnect wires 2 through the SOG film 3 and the low-stress TEOS oxide film 5a. Propagation of the stresses from the high-stress TEOS oxide film 6a is considered to be alleviated by the presence of the low-stress TEOS oxide film 5a.

As above discussed, deposition of the low-stress TEOS oxide film serving as one of the upper and lower layers may reduce the number of contact holes in which the excessive metal depositions (hillocks) are formed as shown in FIG. 3 (wherein the upper layer is the low-stress TEOS oxide film 6). The above described arrangement may suppress the excessive metal depositions (hillocks) 23 and provide the multi-level interconnect interlayer structure which prevents the steps of step coverage and the degradation of the dielectric breakdown voltage. As a result, the metal hillocks are difficult to be created. This eliminates such problems as the metal void 24 shown in FIG. 30, the unevenness of the barrier metal 9P during the formation of the tungsten plug 8P, and the abnormal growth and filling failure of the tungsten 8P, preventing the degradation of the electrical characteristics of the tungsten 8P and the decrease in yield of the device.

(Preferred Embodiment 4)

The semiconductor device according to a fourth preferred embodiment of the present invention is described below with reference to FIGS. 7 and 8.

FIG. 7 illustrates a layout pattern of a contact hole chain resistance measurement TEG. FIG. 8 is a plan view of a lower metal interconnect wire and a dummy interconnect wire provided around the lower metal interconnect wire.

Referring to FIG. 7, metal interconnect wires 12 connected to external terminals (not shown) are connected in the form of a hole chain through upper metal interconnect wires 8, a multiplicity of contact holes 10, 11, and lower metal interconnect wires 9. With reference to FIG. 8, the dummy interconnect wire is provided around the lower metal interconnect wire 9.

The excessive metal depositions (hillocks) 23 described with reference to FIG. 30 are associated with the lower metal interconnect wires 9 of FIG. 7. The experiment using the hole chain TEG has revealed such a performance evaluation result that the metal hillocks in the contact holes are affected by a base interconnect pattern, as will be described hereinafter. When annealing is performed on this TEG pattern at a degassing temperature which is prone to create the excessive metal depositions (hillocks) in the contact holes, the excessive metal depositions (hillocks) 23 shown in FIG. 30 are formed only in the contact holes 10 located in a peripheral area of the chain resistance measurement TEG shown in FIG. 7. On the other hand, no metal hillocks are created in the contact holes 11 in a central area of the TEG pattern.

In view of a specific contact hole, the excessive metal deposition (hillock) 23 is not prone to be formed in the specific contact hole if the specific contact hole is connected to a metal interconnect wire 9 which is surrounded on all sides by the metal interconnect wires on the same level at a relatively short distance therefrom. Conversely, the excessive metal deposition (hillock) 23 is prone to be formed in the specific contact hole if the specific contact hole is connected to a metal interconnect wire 9 having any side on which an adjacent metal interconnect wire on the same level is absent (in an open-space state).

Description will be given with reference to the background art cross-sectional view of FIG. 30. The structure of FIG. 30 includes two metal interconnect wires. Assuming that the left-handed metal interconnect wire 2P corresponds to a lower metal interconnect wire 9 located in the peripheral area in FIG. 7 and the right-handed metal interconnect wire 2P corresponds to a lower metal interconnect wire 9 adjacent the former lower metal interconnect wire 9, it is apparent from FIG. 30 that the SOG film 3P fills the gap between the metal interconnect wires 2P in the central area of the TEG wherein the metal interconnect wires 2P are in closely spaced relation. However, if no other metal interconnect wire is present in an area on the left-handed side of the left-handed metal interconnect wire 2P, the upper interlayer dielectric film 6P is present adjacent the side walls of the metal interconnect wire 2P. In this manner, the excessive metal deposition (hillock) 23 is prone to be formed when the thick interlayer dielectric film 6P is present adjacent the side walls of the metal interconnect wire 2P, but the excessive metal deposition (hillock) 23 is not prone to be formed when the SOG film 3 is present adjacent the side walls of the metal interconnect wire 2P. The excessive metal depositions (hillocks) 23 are considered to be created by the presence of the thick high-stress interlayer dielectric film 6P adjacent the side walls of the metal interconnect wires 2P.

Figure 8:
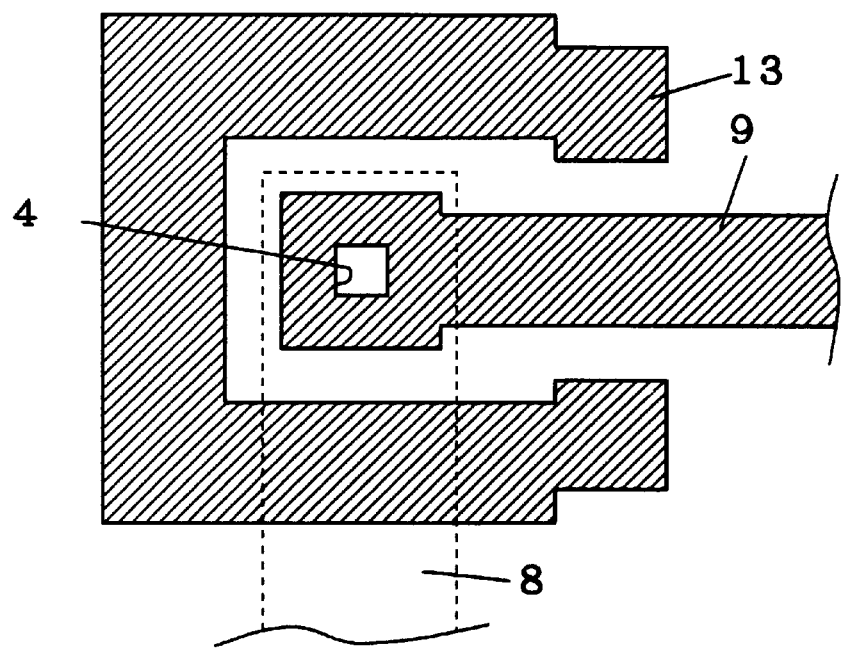
FIG. 8 is a plan view of the layout pattern, with a contact hole and a dummy interconnect wire of the semiconductor device enlarged, according to the fourth preferred embodiment of the present invention.

In view of the above description, the provision of the dummy interconnect wire 13 shown in FIG. 8 on the same level for each metal interconnect wire opposed to the open space prevents the stresses of the thick interlayer dielectric film from being applied to the metal interconnect wire to suppress the excessive metal depositions (hillocks) 23.

However, the provision of the dummy interconnect wires 13 in the open space of all metal interconnect wires increases the parasitic capacitance (wiring capacitance). Therefore, the dummy interconnect wires 13 must be provided only for the open space of the lower metal interconnect wires 9 adjacent and connected to the contact holes 4.

As above described, the provision of the dummy interconnect wires 13 only for the open space of the lower metal interconnect wires 9 may minimize the parasitic capacitance while suppressing the metal hillocks in the contact holes 4. This consequently eliminates such problems as the metal void 24 shown in FIG. 30, the unevenness of the barrier metal 9P during the formation of the tungsten plug 8, and the abnormal growth and filling failure of the tungsten 8P, preventing the degradation of the electrical characteristics of the tungsten 8P and the decrease in yield of the device.

(Preferred Embodiment 5)

The semiconductor device according to a fifth preferred embodiment of the present invention is described below with reference to FIG. 9.

Figure 9:
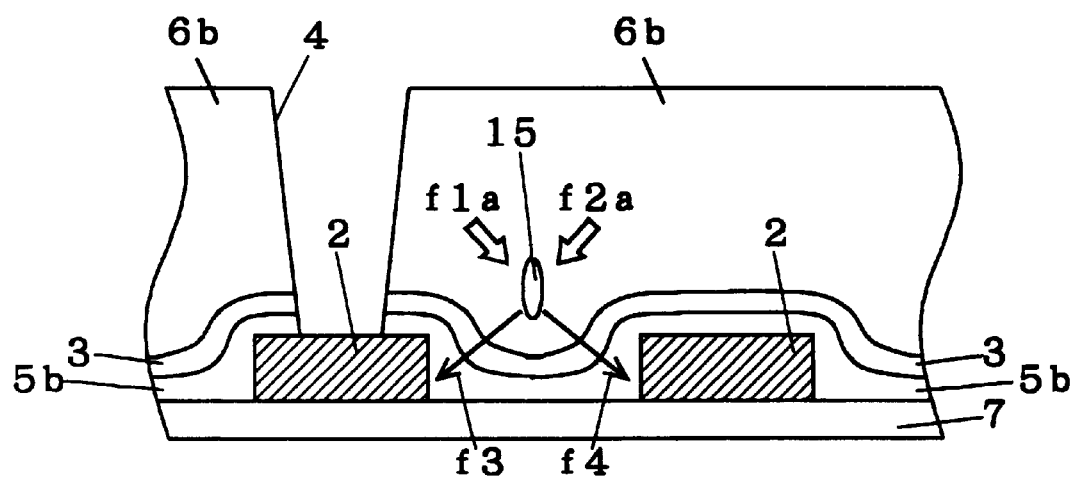
FIG. 9 is an enlarged cross-sectional view of the contact hole portion of the semiconductor device according to a fifth preferred embodiment of the present invention.

FIG. 9 is a cross-sectional view of the semiconductor device according to the fifth preferred embodiment of the present invention.

As depicted in FIG. 9, an $SiO_2$ film (insulation film) 7 serving as the interlayer dielectric film is formed on the bottom, and the metal interconnect wires 2 are formed on the surface of the $SiO_2$ film 7. The TEOS oxide film 5, SOG film 3 and TEOS oxide film 6 serving as the interlayer dielectric films are formed to cover the metal interconnect wires 2. The contact hole 4 is formed which extends to the surface of the metal interconnect wire 2 through the TEOS oxide films 5, 6 and the SOG film 3. In this preferred embodiment, an air gap 15 (space portion) is formed in the TEOS oxide film 6. The TEOS oxide films 5 and 6 in this preferred embodiment are normal TEOS oxide films having the same stress.

In the background art structure, the stresses of the thickness of the TEOS oxide film 6 are directly applied to the metal interconnect wires 2. The direct application of stresses f1a, f2a shown in FIG. 9 to the metal interconnect wires 2 will cause the excessive metal depositions (hillocks) 23 shown in FIG. 30. Thus, it is necessary to consider a method of alleviating the stresses f1a, f2a so that the stresses are not directly applied to the side walls of the metal interconnect wires 2. To alleviate the stresses, the air gap 15 through which the stresses f1a and f2a from the TEOS oxide film 6 are propagated is formed in the TEOS oxide film 6 to decrease stresses f3 and f4 applied to the side walls of the metal interconnect wires 2, preventing the metal hillocks.

As above described, the provision of the air gap 15 in the TEOS oxide film 6 may prevent the metal hillocks. This eliminates such problems as the metal void 24 of FIG. 30, the unevenness of the barrier metal 9P during the formation of the tungsten plug 8P, and the abnormal growth and filling failure of the tungsten 8P, preventing the degradation of the electrical characteristics of the tungsten 8P and the decrease in yield of the device.

(Method of Fabrication of Preferred Embodiment 5)

A method of fabricating the semiconductor device for the multi-level interconnection structure described with reference to FIG. 9 will be discussed below with reference to FIGS. 10 through 15.

Figure 10:
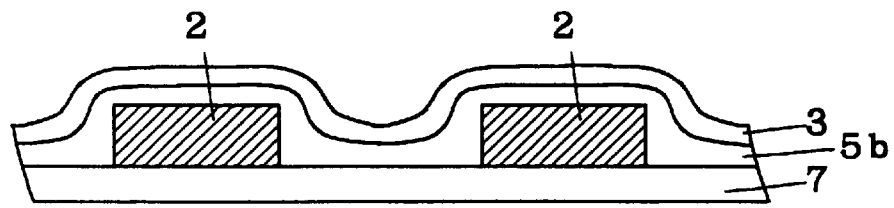
FIGS. 10 through 15 are cross-sectional views showing respective steps of fabrication of the semiconductor device according to the fifth preferred embodiment of the present invention.

The fabrication steps of providing the structure of FIG. 10 are identical with those of the background art shown in FIGS. 31 through 33.

Figure 11:
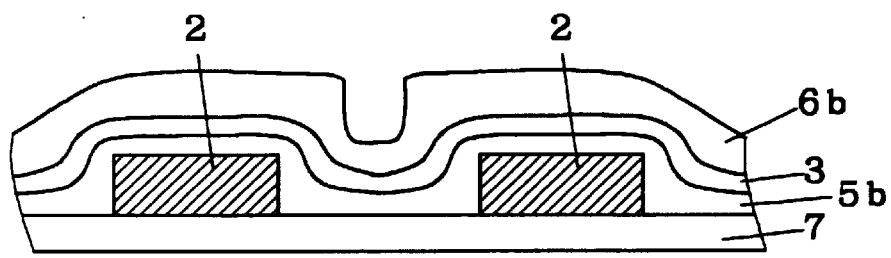
Figure 12:
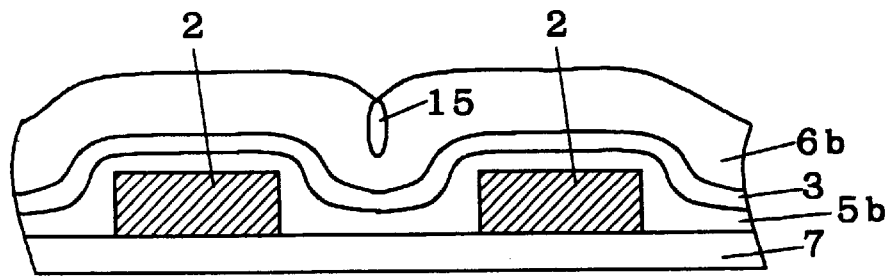

After the fabrication step of FIG. 10, the gas type, deposition temperature and pressure of the CVD reactor system are controlled during the deposition of the TEOS oxide film 6 so that the molecules once deposited are not released into the vapor phase again (sticking probability) as illustrated in FIG. 11. Then, the TEOS oxide film 6 is formed with a hole-like gap in the middle of the TEOS oxide film 6. Thereafter, as the TEOS oxide film 6 is deposited in substantial amount, the air gap 15 is formed in the TEOS oxide film 6 in the middle of the spacing between both of the metal interconnect wires 2 as shown in FIG. 12. The TEOS oxide film 6 is deposited to its final thickness, and the air gap 15 is left in the TEOS oxide film 6 in completely isolated relation to the exterior as shown in FIG. 13.

Figure 13:
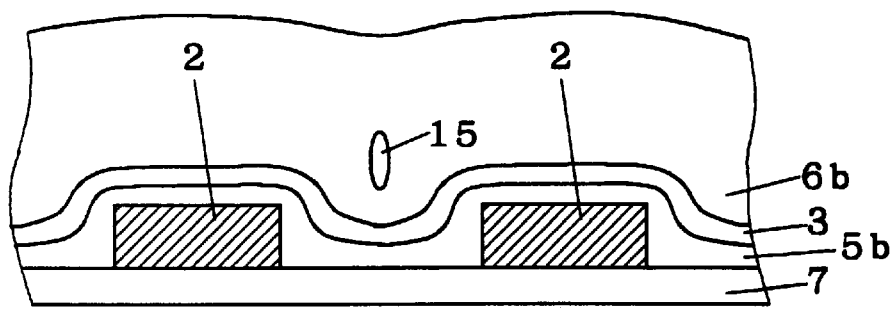
Figure 14:
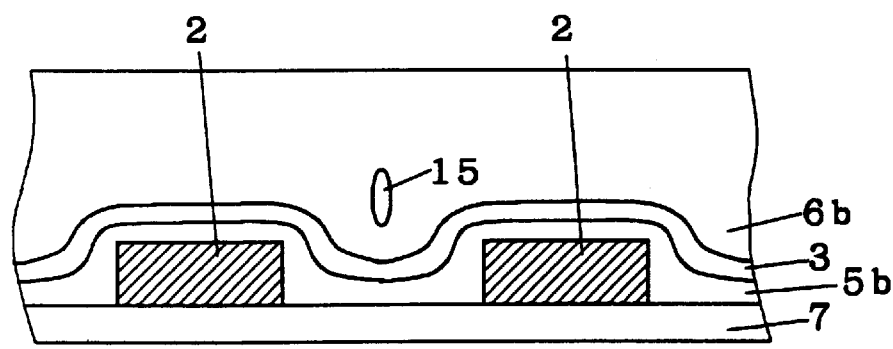

After the fabrication step of FIG. 13, the TEOS oxide film 6 is flattened by the CMP technique as illustrated in FIG. 14. During this fabrication step, the air gap 15 is present in the TEOS oxide film 6.

Figure 15:
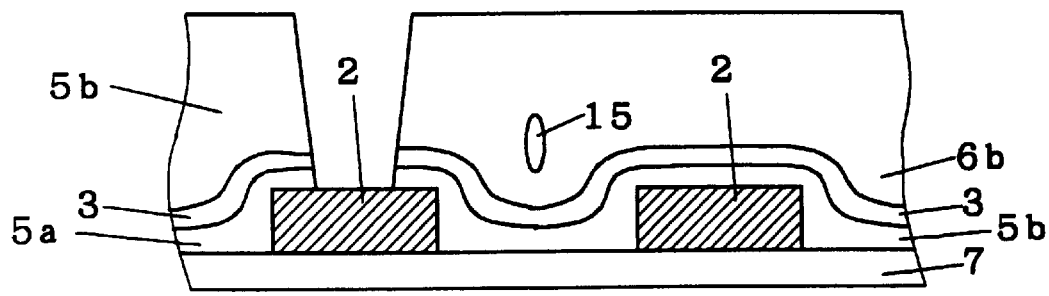

After the fabrication step of FIG. 14, the contact hole 4 is formed by photolithography and anisotropic etching as shown in FIG. 15 to accomplish the semiconductor device of FIG. 9.

As above described, the air gap 15 may be produced in the TEOS oxide film 6 in the fabrication steps of FIGS. 10 through 15, suppressing the metal hillocks which have been formed in the background art.

(Preferred Embodiment 6)

The semiconductor device according to a sixth preferred embodiment of the present invention is described below with reference to FIG. 16.

Figure 16:
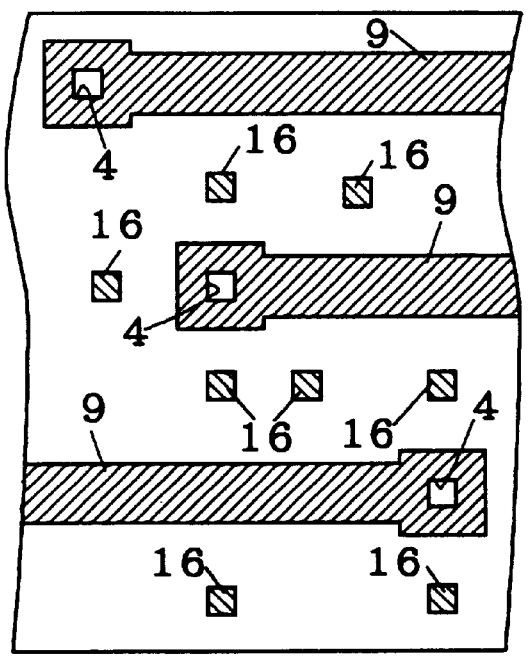
FIG. 16 is a plan view of the layout pattern of a metal interconnect wire portion of the semiconductor device according to a sixth preferred embodiment of the present invention.

FIG. 16 is a plan view of a layout pattern of a metal interconnect wire portion of the semiconductor device for the multi-level interconnection structure.

Referring to FIG. 16, a plurality of dummy holes 16 (space portions) which are similar in configuration to the contact holes (contact hole configuration) are provided between the lower metal interconnect wires 9 in non-contacting relationship with the lower metal interconnect wires 9.

As illustrated in FIG. 16, the dummy holes 16, similar to the air gap 15 of the fifth preferred embodiment, are provided to alleviate the stresses so that the stresses of the TEOS oxide film 6 shown in FIG. 9 are not directly applied to the lower metal interconnect wires 9. This prevents the hillocks of the lower metal interconnect wires 9.

As above described, the provision of the plurality of dummy holes 16 adjacent the lower metal interconnect wires 9 for stress release may suppress the metal hillocks which have been created during the background art degassing. This eliminates such problems as the metal void 24 of FIG. 30, the unevenness of the barrier metal 9P during the formation of the tungsten plug 8P, and the abnormal growth and filling failure of the tungsten 8P, preventing the degradation of the electrical characteristics of the tungsten 8P and the decrease in yield of the device.

(Modification of Preferred Embodiment 6)

Figure 17:
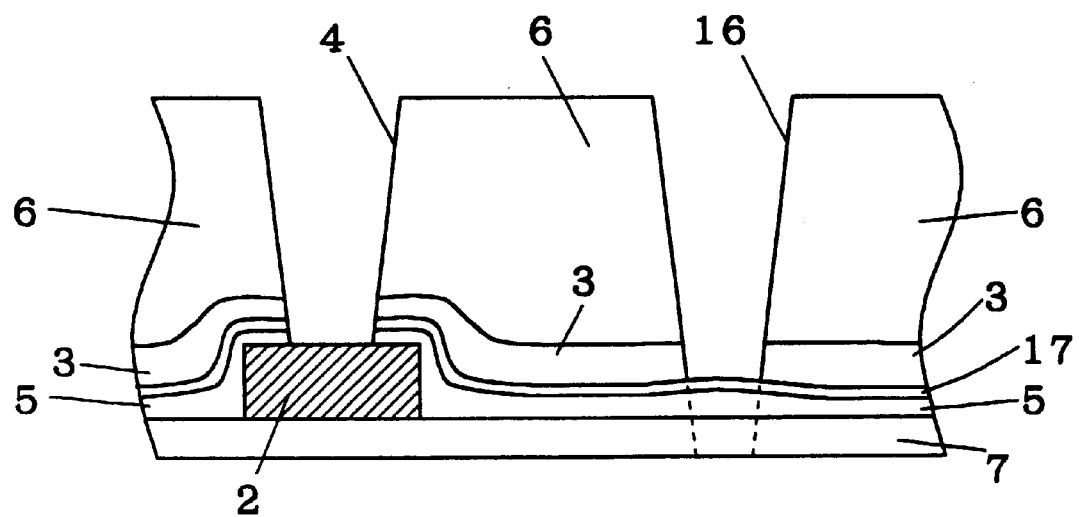
FIG. 17 is an enlarged cross-sectional view of the contact hole portion of the semiconductor device according to the sixth preferred embodiment of the present invention.

FIG. 17 is a cross-sectional view of a modification of the semiconductor device according to the sixth preferred embodiment of the present invention.

In the structure of FIG. 17, the dummy hole 16 extending through the TEOS oxide films 5, 6 and the SOG film 3 to the insulation film (interlayer dielectric film) 7 serving as a base is deeper than the normal contact hole 4 by the amount of overetching during the hole formation. The dummy hole 16 might reach a lower metal interconnect layer depending upon the overetching amount as shown by the dotted lines of FIG. 17. If the dummy hole 16 does not reach the lower metal interconnect layer, an upper metal interconnect layer (not shown) may pass over the dummy hole 16, allowing a flexible layout. However, if the dummy hole 16 is in contact with the lower metal interconnect layer, an electrical short circuit can be developed between the upper and lower metal interconnect layers.

To solve the short circuit problem, the modification of FIG. 17 features an etching stopper layer 17 on the upper surface of the lower metal interconnect layer. The provision of the etching stopper layer 17 may prevent the overetching. It should be noted that the etching stopper layer 17 may be of any material which allows a high selection ratio for etching of the TEOS oxide films 5, 6 and the SOG film 3. For example, when the $SiO_2$ film is used as the interlayer dielectric film 7, an $Si_3N_4$ film may be used as the etching stopper layer 17.

(Preferred Embodiment 7)

The semiconductor device according to a seventh preferred embodiment of the present invention is described below with reference to FIGS. 18A and 18B.

Figure 18A:
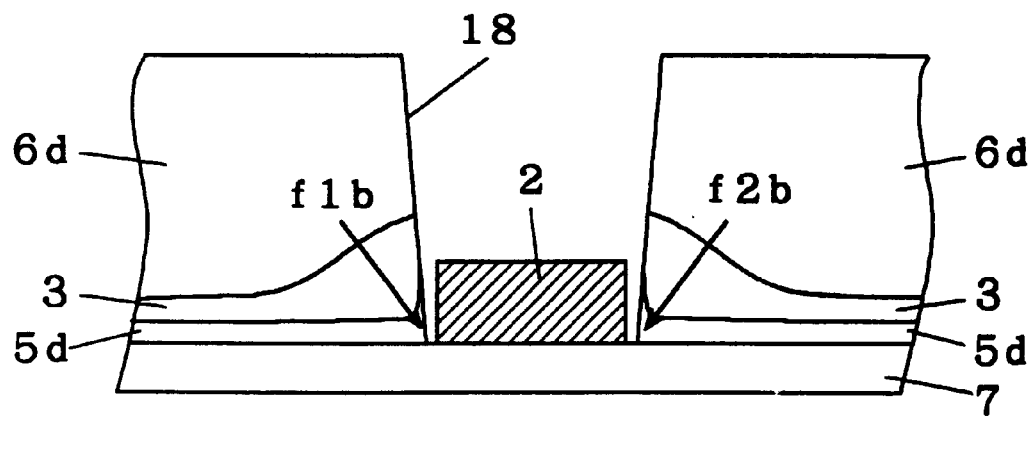
FIG. 18A is an enlarged cross-sectional view of the contact hole portion of the semiconductor device according to a seventh preferred embodiment of the present invention.
Figure 18B:
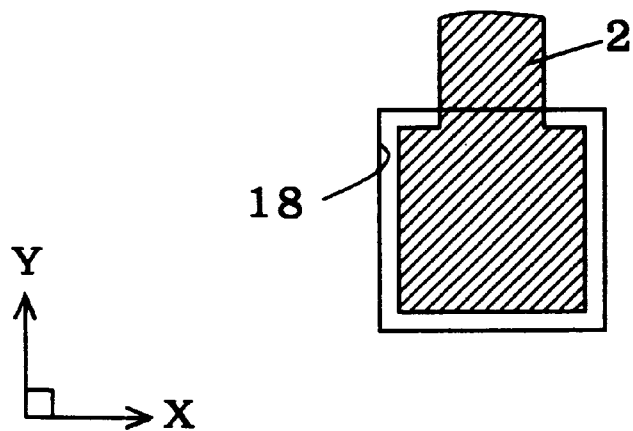
FIG. 18B is an enlarged plan view of the contact hole portion of the semiconductor device according to the seventh preferred embodiment of the present invention.

FIG. 18A is a cross-sectional view of the semiconductor device according to the seventh preferred embodiment of the present invention. FIG. 18B is a plan view of the metal interconnect wire 2 shown in FIG. 18A.

As depicted in FIG. 18A, the $SiO_2$ film 7 serving as the interlayer dielectric film is formed on the bottom, and the metal interconnect wire 2 is formed on the surface of the $SiO_2$ film 7. In the fabrication step preceding the fabrication step shown in FIG. 18A, the TEOS oxide film 5, SOG film 3, and TEOS oxide film 6 serving as the interlayer dielectric films are formed once to cover the metal interconnect wire 2. In the seventh preferred embodiment, an enlarged contact hole 18 is formed so that the metal interconnect wire 2 is out of contact with the TEOS oxide films 5, 6 and the SOG film 3. It will be appreciated from the illustration of FIG. 18B that the metal interconnect wire 2 is completely exposed in the contact hole 18.

Referring to FIG. 18A, when stresses f1b and f2b of the thickness of the upper TEOS oxide film 6 may be propagated to the SOG film 3 and the lower TEOS oxide film 5, the stresses f1b, f2b are not propagated to the side walls of the metal interconnect wire 2 since the contact hole 18 is sufficiently wide (or space is present around the metal interconnect wire 2). The formation of the contact hole 18 which is greater than the metal interconnect wire 2 prevents the film stresses to be directly applied to the metal interconnect wire 2. That is, the metal hillocks may be suppressed in this case when the degassing is performed at a high temperature.

The provision of the enlarged contact hole 18 may suppress the metal hillocks which have been formed during the background art degassing. This consequently eliminates such problems as the metal void 24 of FIG. 30, the unevenness of the barrier metal 9P during the formation of the tungsten plug 8P, and the abnormal growth and filling failure of the tungsten 8P, preventing the degradation of the electrical characteristics of the tungsten 8P and the decrease in yield of the device.

(Preferred Embodiment 8)

The semiconductor device according to an eighth preferred embodiment of the present invention is described below with reference to FIG. 19.

Figure 19:
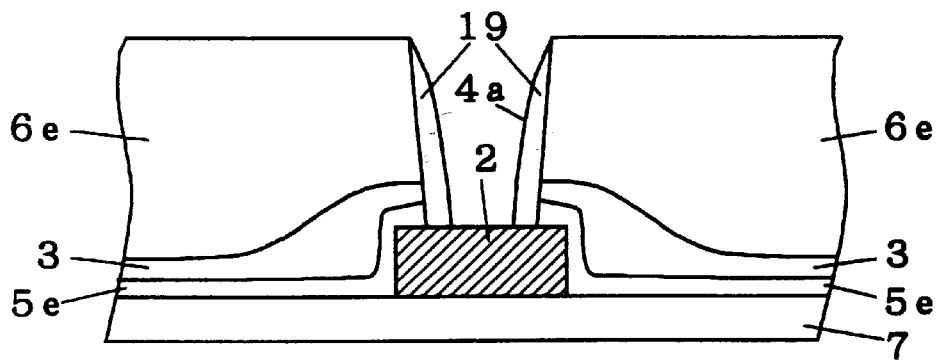
FIG. 19 is an enlarged cross-sectional view of the contact hole portion of the semiconductor device according to an eighth preferred embodiment of the present invention.

FIG. 19 is a cross-sectional view of the semiconductor device according to the eighth preferred embodiment of the present invention.

As depicted in FIG. 19, the $SiO_2$ film 7 serving as the interlayer dielectric film is formed on the bottom, and the metal interconnect wire 2 is formed on the surface of the $SiO_2$ film 7. The lower TEOS oxide film 5, SOG film 3, and upper TEOS oxide film 6 serving as the interlayer dielectric films are formed to cover the metal interconnect wire 2. In the eighth preferred embodiment, the contact hole extends to the surface of the metal interconnect wire 2 through the upper and lower TEOS oxide films 5, 6 and the SOG film 3. The contact hole is partially filled with a side wall 19 (cover portion) to form a contact hole 4a.

The degassing performed herein includes heat treatment for releasing gases such as $H_2$ and $H_2O$ contained in the SOG film 3 in a large amount. However, as illustrated in FIG. 19, the side wall 19 provided partially in the contact hole may prevent the production of gases such as $H_2$ and $H_2O$ contained in the SOG film 3, resulting in release of no gases. This eliminates the execution of the degassing itself to suppress the metal hillocks formed during the degassing.

As mentioned above, the provision of the side wall 19 in the contact hole may eliminate the need for the degassing itself to suppress the metal hillocks which have been formed in the background art while simplifying the fabrication steps of the semiconductor device. This consequently eliminates such problems as the metal void 24 of FIG. 30, the unevenness of the barrier metal 9P during the formation of the tungsten plug 8P, and the abnormal growth and filling failure of the tungsten 8P, preventing the degradation of the electrical characteristics of the tungsten 8P and the decrease in yield of the device.

(Modification of Preferred Embodiment 8)

Figure 23:
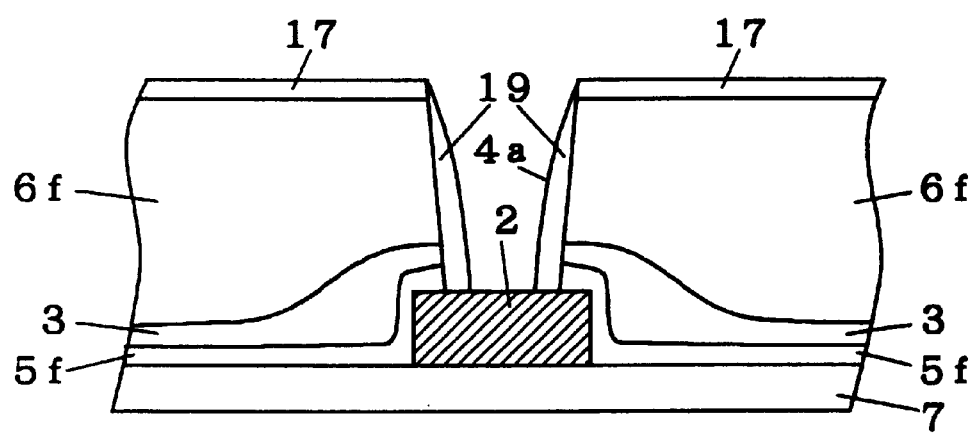
FIG. 23 is an enlarged cross-sectional view of the contact hole portion of the semiconductor device with an etching stopper layer according to the eighth preferred embodiment of the present invention.

FIG. 23 is a cross-sectional view of a modification of the semiconductor device according to the eighth preferred embodiment of the present invention.

With the structure of FIG. 19, the etchback process for formation of the side wall 19 is performed, for example, for a specified period of time. However, the specification of time period creates the likelihood of overetching during the etchback. The overetching might decrease the thickness of the TEOS oxide film 6 shown in FIG. 19 and increase the interlayer capacitance of the metal interconnect wire. The decrease in thickness of the TEOS oxide film 6 also might decrease the top diameter of the contact hole 4a to decrease the overlap margin with the upper metal interconnect wire not shown. To solve these problems, or to prevent the decrease in thickness of the TEOS oxide film 6, the modification of the eighth preferred embodiment features the etching stopper film 17 shown in FIG. 23 on the top surface.

The etching stopper film 17 is formed so that etching stops at a suitable position during the etchback to be described below in the method of fabrication of the eight preferred embodiment. In this manner, the etching stopper film 17 formed on the surface of the TEOS oxide film 6 may prevent the excessive etchback to achieve the above mentioned functions and effects. As the etching stopper film 17 is used a material which allows a high selection ratio for the etching for forming the contact hole in the interlayer dielectric films, such as $Si_3N_4$ film.

(Method of Fabrication of Preferred Embodiment 8)

The method of fabricating the semiconductor device for the multi-level interconnection structure described with reference to FIG. 19 will be discussed with reference to FIGS. 20 through 22.

Figure 20:
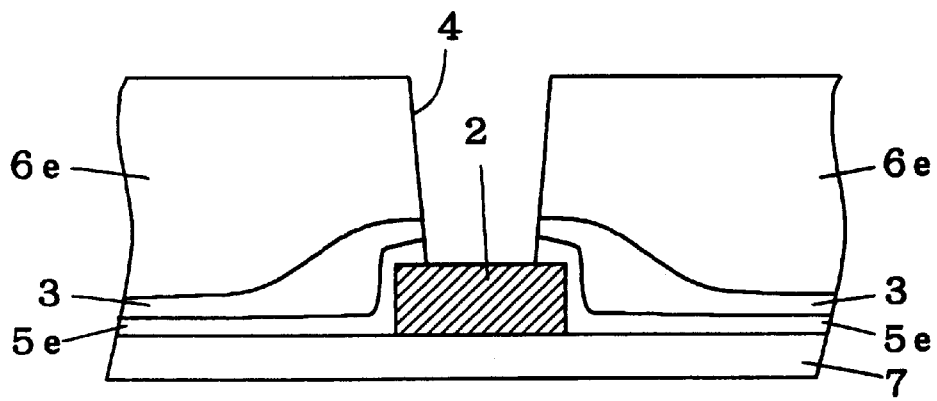
FIGS. 20 through 22 are cross-sectional views showing respective steps of fabrication of the semiconductor device according to the eighth preferred embodiment of the present invention.

The fabrication steps of providing the structure of FIG. 20 are identical with those of the background art shown in FIGS. 31 through 35.

Figure 21:
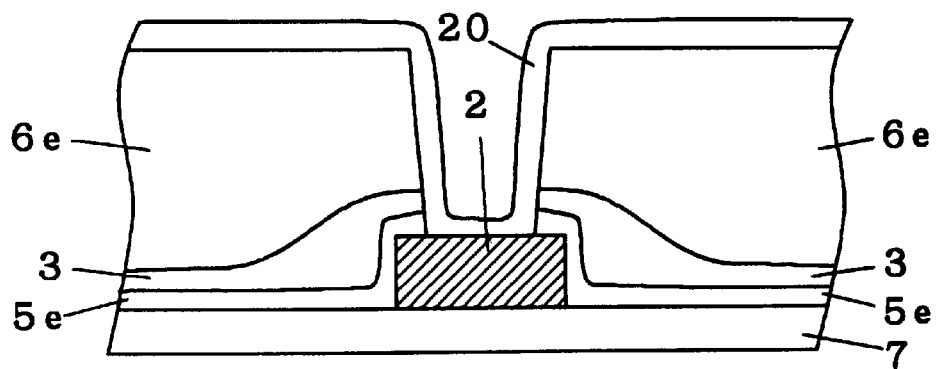

After the fabrication step of FIG. 20, a side wall formation film 20 is deposited over the surfaces of the TEOS oxide film 6 and the metal interconnect wire 2 as illustrated in FIG. 21.

Figure 22:
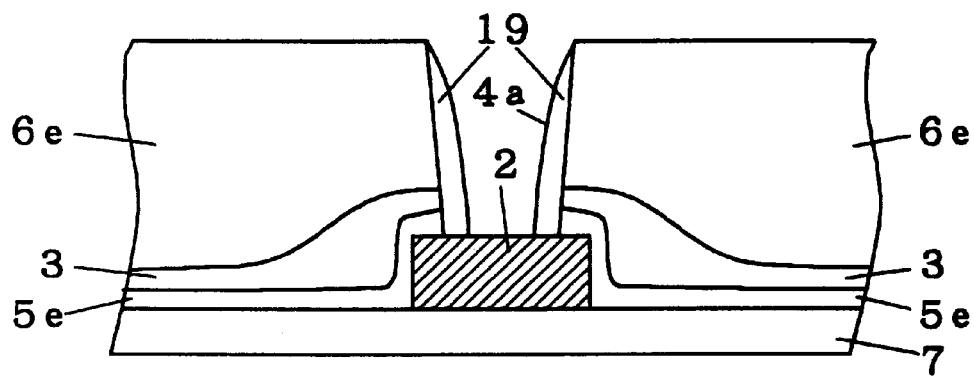

After the fabrication step of FIG. 21, the deposited side wall formation film 20 is etched back by the amount of the thickness thereof to provide the side wall 19 shown in FIG. 19 over the side surfaces of the contact hole 4 as illustrated in FIG. 22.

(Preferred Embodiment 9)

The semiconductor device according to a ninth preferred embodiment of the present invention is described below with reference to FIG. 24.

Figure 24:
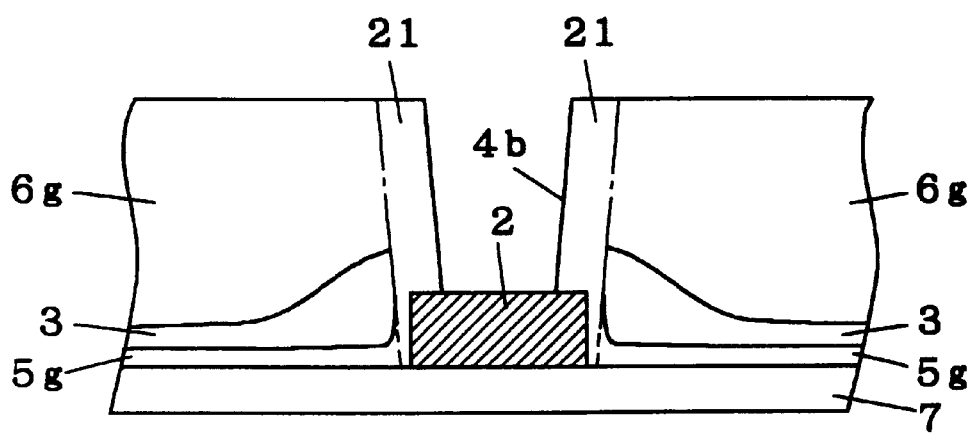
FIG. 24 is an enlarged cross-sectional view of the contact hole portion of the semiconductor device according to a ninth preferred embodiment of the present invention.

FIG. 24 is a cross-sectional view of the semiconductor device according to the ninth preferred embodiment of the present invention.

As depicted in FIG. 24, the $SiO_2$ film 7 serving as the interlayer dielectric film is formed on the bottom, and the metal interconnect wire 2 is formed on the surface of the $SiO_2$ film 7. The lower TEOS oxide film 5, SOG film 3, and upper TEOS oxide film 6 serving as the interlayer dielectric films are deposited to cover the metal interconnect wire 2. In the ninth preferred embodiment, a gas release prevention layer 21 (gas release prevention film) is formed in such a manner that these interlayer dielectric films, particularly the SOG film 3, are not exposed in a contact hole 4b. The contact hole 4b extends to the surface of the metal interconnect wire 2 through the upper and lower TEOS oxide films 6, 5 and the SOG film 3.

The contact hole 4a shown in FIG. 19 has a bottom diameter which is much smaller than the top diameter thereof. This increases the wiring pitch of the upper metal interconnect wires (not shown) to cause difficulty in size reduction of the device. To solve the problem, the ninth preferred embodiment employs the gas release prevention layer 21 (FIG. 24) in place of the side wall 19 of FIG. 19 to minimize the top and bottom diameters of the contact hole 4b. As a result, the wiring pitch of the upper metal interconnect wires is decreased, and size reduction of the device is achieved.

Referring to FIG. 24, the gas release prevention layer 21 is provided in place of the side wall 19 of FIG. 19 in the contact hole 4b. Similar to the structure of the eighth preferred embodiment, such an arrangement may prevent the release of gases such as $H_2$ and $H_2O$ from the SOG film 3 to eliminate the need for the degassing itself which has been required in the background art.

The use of the gas release prevention layer 21 in place of the side wall 19 of FIG. 19 in this manner may eliminate the need for the degassing itself to permit the decrease in wiring pitch of the metal interconnect wires for size reduction of the device, suppressing the metal hillocks which have been formed in the background art. This consequently eliminates such problems as the metal void 24 of FIG. 30, the unevenness of the barrier metal 9P during the formation of the tungsten plug 8P, and the abnormal growth and filling failure of the tungsten 8P, preventing the degradation of the electrical characteristics of the tungsten 8P and the decrease in yield of the device.

(Method of Fabrication of Preferred Embodiment 9)

The method of fabricating the semiconductor device for the multi-level interconnection structure described with reference to FIG. 24 will be discussed below with reference to FIGS. 25 through 29.

Figure 25:
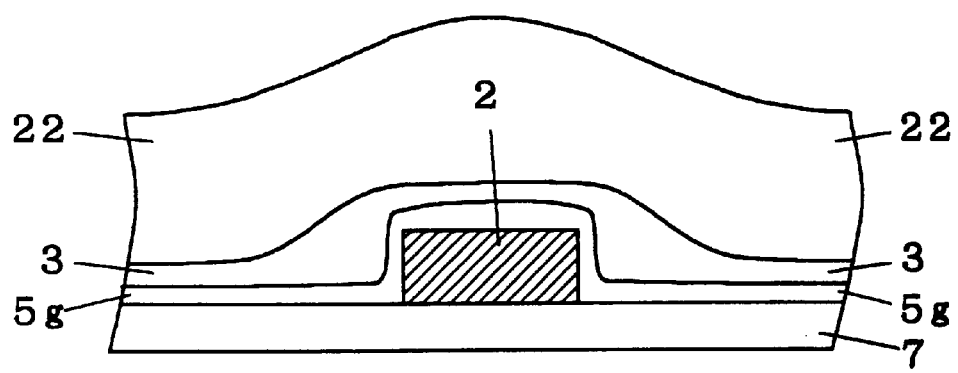

After the fabrication steps of the background art shown in FIGS. 31 through 33, a photoresist 22 is applied to the entire surface of the SOG film 3 to provide the structure of FIG. 25.

Figure 26:
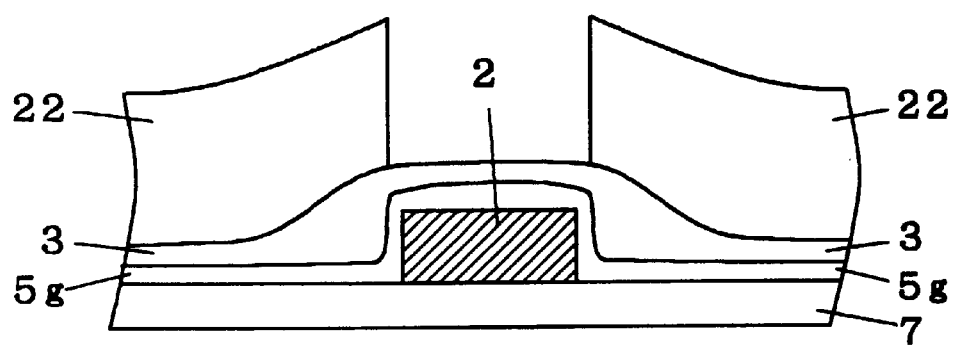

After the fabrication step of FIG. 25, the photoresist 22 is exposed to light to remove unnecessary parts of the photoresist 22 in such a manner that the amount of light is controlled to form a contact hole having a diameter greater than the width of the metal interconnect wire 2 as illustrated in FIG. 26.

Figure 27:
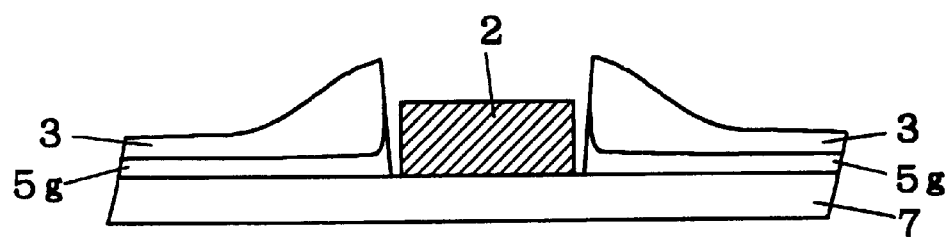

After the fabrication step of FIG. 26, parts of the SOG film 3 and TEOS oxide film 5 which are adjacent the metal interconnect wire 2 are removed by anisotropic etching, and the photoresist 22 is removed as illustrated in FIG. 27.

After the fabrication step of FIG. 27, the TEOS oxide film 6 is deposited to a suitable thickness to form the TEOS oxide film 6 shown in FIG. 28.

After the fabrication step of FIG. 28, as illustrated in FIG. 29, the TEOS oxide film 6 shown in FIG. 28 is polished to a thickness indicated by the dotted line of FIG. 28 by the CMP technique for flattening. Then, the contact hole 4b is formed, and the gas release prevention film 21 shown in FIG. 24 is provided.

While the invention has been described in detail, the foregoing description is in all aspects illustrative and not restrictive. It is understood that numerous other modifications and variations can be devised without departing from the scope of the invention.

We claim:

1. A semiconductor device having a multi-level interconnection structure comprising:

a metal interconnect wire formed on an insulation film serving as a base;

a first interlayer dielectric film formed to cover said metal interconnect wire;

a second interlayer dielectric film formed on said first interlayer dielectric film;

a third interlayer dielectric film formed on said second interlayer dielectric film; and a contact hole extending through said first, second, and third interlayer dielectric films to a surface of said metal interconnect wire, said first and third interlayer dielectric films having different stresses, and one of the first and third interlayer dielectric films being a relative low stress film having a higher etching rate and lower dielectric breakdown voltage than the other of the first and third interlayer dielectric films.

2. The semiconductor device of claim 1, wherein said first and third interlayer dielectric films are made of the same material.

3. The semiconductor device of claim 2, wherein said third interlayer dielectric film has a lower stress and a greater thickness than said first interlayer dielectric film.

4. A semiconductor device having a multi-level interconnection structure comprising:

a metal interconnect wire formed on an insulation film serving as a base;

an interlayer dielectric film formed to cover said metal interconnect wire; and a contact hole extending through said interlayer dielectric film to a surface of said metal interconnect wire, wherein said metal interconnect wire having said contact hole includes a plurality of metal interconnect wires, and dummy metal interconnect wires are provided adjacent only some of said metal interconnect wires which surround contact holes located in a peripheral area of said semiconductor device.

5. A semiconductor device having a multi-level interconnection structure comprising:

a metal interconnect wire formed on an insulation film serving as a base;

an interlayer dielectric film formed to cover said metal interconnect wire; and a contact hole extending through said interlayer dielectric film to a surface of said metal interconnect wire, wherein a space portion including no solid layer is provided in said interlayer dielectric film adjacent said metal interconnect wire.

6. The semiconductor device of claim 5, wherein said space portion is formed as an air gap in said interlayer dielectric film.

7. The semiconductor device of claim 5, wherein said space portion includes a plurality of space portions of a contact hole configuration.

8. The semiconductor device of claim 5, wherein said space portion is a space provided by enlarging said contact hole so that said metal interconnect wire is out of contact with said interlayer dielectric film.

9. A semiconductor device having a multi-level interconnection structure comprising:

a metal interconnect wire formed on an insulation film serving as a base;

an interlayer dielectric film formed to cover said metal interconnect wire;

a contact hole formed by filling inner side surfaces of a hole with a cover portion, said cover portion being insulative, said hole extending through said interlayer dielectric film to a surface of said metal interconnect wire.

10. The semiconductor device of claim 9, wherein said cover portion covers the entire side surfaces of said hole.

11. The semiconductor device of claim 10, wherein said cover portion is a side wall.

12. The semiconductor device of claim 10, wherein said cover portion includes a gas release prevention film provided by once filling said hole and then forming said contact hole.

* * * * *